United States Patent
Lee

(10) Patent No.: US 8,309,458 B2
(45) Date of Patent: Nov. 13, 2012

(54) SEMICONDUCTOR DEVICE COMPRISING VARIABLE-SIZED CONTACT, METHOD OF FORMING SAME, AND APPARATUS COMPRISING SAME

(75) Inventor: Keun-bong Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 15 days.

(21) Appl. No.: 13/079,941

(22) Filed: Apr. 5, 2011

(65) Prior Publication Data

US 2011/0266698 A1 Nov. 3, 2011

(30) Foreign Application Priority Data

May 3, 2010 (KR) .................. 10-2010-0041446

(51) Int. Cl.
*H01L 21/4763* (2006.01)

(52) U.S. Cl. . 438/638; 438/622; 438/629; 257/E23.145; 257/750; 257/774; 716/112; 716/122

(58) Field of Classification Search ................ 438/118, 438/129, 622, 629, 637, 638, 652, 674; 257/E23.02, 257/E27.105, E23.145, E23.152, E21.159, 257/48, 750, 758, 774, 775; 716/50, 112, 716/115, 122, 123

See application file for complete search history.

(56) References Cited

U.S. PATENT DOCUMENTS

| | | | | |
|---|---|---|---|---|
| 6,040,748 | A * | 3/2000 | Gueissaz | 335/78 |
| 6,442,744 | B1 * | 8/2002 | Ishii | 716/123 |
| 7,185,296 | B2 * | 2/2007 | Ohba et al. | 716/115 |
| 7,523,436 | B2 * | 4/2009 | Mizuno et al. | 716/50 |
| 2002/0083405 | A1 * | 6/2002 | Ishikura | 716/7 |
| 2004/0128636 | A1 * | 7/2004 | Ishikura | 716/7 |
| 2006/0189041 | A1 * | 8/2006 | Mizuno et al. | 438/129 |
| 2008/0061441 | A1 * | 3/2008 | Liu | 257/774 |
| 2008/0203573 | A1 * | 8/2008 | Usui et al. | 257/758 |
| 2009/0013296 | A1 * | 1/2009 | Katsuzawa | 716/10 |
| 2011/0044091 | A1 * | 2/2011 | Bertin et al. | 365/148 |

FOREIGN PATENT DOCUMENTS

| | | |
|---|---|---|
| JP | 2004031439 A | 1/2004 |
| JP | 2004047526 A | 2/2004 |
| JP | 2004055919 A | 2/2004 |

* cited by examiner

*Primary Examiner* — Chris Chu
(74) *Attorney, Agent, or Firm* — Volentine & Whitt, PLLC

(57) ABSTRACT

A semiconductor device comprises an electrical contact designed to reduce a contact resistance. The electrical contact has a size that varies according to a length of a region where the contact is to be formed.

12 Claims, 8 Drawing Sheets

SEMICONDUCTOR DEVICE COMPRISING VARIABLE-SIZED CONTACT, METHOD OF FORMING SAME, AND APPARATUS COMPRISING SAME

CROSS-REFERENCE TO RELATED APPLICATIONS

This application claims priority under 35 U.S.C. §119 to Korean Patent Application No. 10-2010-0041446 filed on May 3, 2010, the disclosure of which is hereby incorporated by reference in its entirety.

BACKGROUND OF THE INVENTION

Embodiments of the inventive concept relate generally to semiconductor devices. More particularly, embodiments of the inventive concept relate to semiconductor devices comprising electrical contacts that connect upper and lower conductive portions to each other, and methods of forming the contacts.

Semiconductor devices continue to achieve increasing levels of integration. Accordingly, critical dimensions of the devices must be decreased, and features such as vias and electrical contacts must be formed with smaller and smaller dimensions. As vias and electrical contacts are formed with smaller dimensions, they tend to exhibit smaller contact resistances, which can lead to deterioration of performance.

As an example, vias and contacts are commonly used to connect metal wires formed in different layers of a semiconductor device. The resistances of the vias or contacts are typically larger than the resistances of the metal wires, so the vias or contacts create parasitic resistances that can deteriorate overall circuit characteristics. Moreover, having a small number of contacts or vias cause an increase in parasitic resistances and a reduction in yield.

SUMMARY OF THE INVENTION

Embodiments of the inventive concept provide semiconductor devices comprising electrical contacts having sizes that vary according to the sizes of regions where the contacts are formed. These embodiments can reduce resistances of the electrical contacts.

Embodiments of the inventive concept also provide methods for forming the variable-sized contacts, and apparatuses incorporating the semiconductor devices.

According to one embodiment of the inventive concept, a method of forming a variable-sized contact comprises forming a lower conductive portion on a substrate, forming at least one insulating layer on the lower conductive portion, forming an upper conductive portion on the at least one insulating layer, the upper conductive portion overlapping the lower conductive portion in a first direction to define an overlap region having a first length, calculating a horizontal cross-sectional width of the variable-sized contact according to the first length, and forming the variable-sized contact with the horizontal cross-sectional width in the first direction, the variable-sized contact connecting the lower conductive portion to the upper conductive portion.

In certain embodiments, where the first length is greater than a minimum length required to form one fixed contact and less than a minimum length required to form two fixed contacts, the horizontal cross-sectional width of the variable-sized contact is between a horizontal cross-sectional width of a fixed contact and a sum of a distance between two fixed contacts and horizontal cross-sectional widths of the two fixed contacts.

In certain embodiments, where the first length is A, a horizontal cross-sectional width of a fixed contact is B, and a distance between two fixed contacts is C, the horizontal cross-sectional width of the variable-sized contact is between B and $2*B+C$.

In certain embodiments, a minimum horizontal cross-sectional width of the variable-sized contact is between $1.5*B$ and $2*B$.

In certain embodiments, calculating of the horizontal cross-sectional width of the variable-sized contact comprises calculating A, determining a distance D from a boundary line of the overlap region to the fixed contact, determining whether A is greater than or equal to $2*B+2*D+C$, upon determining that A is greater than or equal to $2*B+2*D+C$, defining the horizontal cross-sectional width of the variable-sized contact as B, and forming two variable-sized contacts in the overlap region, upon determining that A is less than $2*B+2*D+C$, determining whether A is greater than or equal to $B+2*D$, and upon determining that A is greater than or equal to $B+2*D$, defining the horizontal cross-sectional width of the variable-sized contact as $A-2*D$, and forming only one variable-sized contact in the overlap region.

In certain embodiments, a computer program automatically performs the calculating A, the determining whether A is greater than or equal to $2*B+2*D+C$, and the determining whether A is greater than or equal to $B+2*D$.

In certain embodiments, the overlap region has a second length A' in a second direction perpendicular to the first direction, a distance D' separates the variable-sized contact from a boundary line of the overlap region, the fixed contact has a horizontal cross-sectional width B', and the variable-sized contact has a horizontal cross-sectional width in the second direction that is between B' and $2*B'+C$.

In certain embodiments, where the first length is greater than a minimum length required to form one fixed contact and is less than a length required to form n fixed contacts (n>2), m variable-sized contacts are formed, wherein m is an integer less than or equal to n/2, and respective horizontal cross-sectional widths of the variable-sized contacts are greater than or equal to a horizontal cross-sectional width of one fixed contact and less than a sum of a distance between two fixed contacts and horizontal cross-sectional widths of the two fixed contacts.

In certain embodiments, a predetermined number of variable-sized contacts are formed with a first horizontal cross-sectional width less than a sum of a distance between n contacts (n>2) and horizontal cross-sectional widths of the n contacts.

In certain embodiments, the variable-sized contacts comprise a combination of a first variable-sized contact having the first horizontal cross-sectional width and second variable-sized contacts having a second horizontal cross-sectional width less than a sum of a distance between m contacts and horizontal cross-sectional widths of the m contacts, where m is a positive integer.

According to another embodiment of the inventive concept, a semiconductor device comprises a lower conductive portion formed on a substrate, an insulating layer formed on the lower conductive portion, an upper conductive portion formed on the insulating layer and overlapping the lower conductive portion in a first direction to define an overlap region having a first length, and a variable-sized contact connecting the lower conductive portion and the upper conductive portion and having a horizontal cross-sectional width in the first direction that varies according to the first length.

In certain embodiments, where the first length is greater than a minimum length required for forming one fixed contact and is less than a minimum length required for forming two fixed contacts, the variable-sized contact is formed with a horizontal cross-sectional width between a horizontal cross-sectional width of a fixed contact and a sum of a distance between two fixed contacts and horizontal cross-sectional widths of the two fixed contacts.

In certain embodiments, where the first length is A, a horizontal cross-sectional width of a fixed contact is B, and a distance between two fixed contacts is C, the horizontal cross-sectional width of the variable-sized contact is between B and 2*B+C.

In certain embodiments, a minimum horizontal cross-sectional width of the variable-sized contact is within a range of 1.5*B to 2*B.

In certain embodiments, the overlap region has a second length of A' in a second direction perpendicular to the first direction, the fixed contact has a horizontal cross-sectional width of B' in the second direction, and the horizontal cross-sectional width of the variable-sized contact in the second direction is between B' and 2*B'+C.

In certain embodiments, the semiconductor device further comprises a predetermined number of variable-sized contacts formed with a first horizontal cross-sectional width that is less than a sum of a distance between n fixed contacts and horizontal cross-sectional widths of the n fixed contacts, where n is an integer greater than 2.

In certain embodiments, the variable-sized contacts comprise a combination of a first variable-sized contact having the first horizontal cross-sectional width and second variable-sized contacts having a second horizontal cross-sectional width that is less than a sum of a distance between m fixed contacts and horizontal cross-sectional widths of the m fixed contacts, where m is an integer smaller than n.

In certain embodiments, the lower and upper conductive portions each comprise a semiconductor or a metal, and the electrical contact comprises a metal.

According to another embodiment of the inventive concept, a method of forming an electrical contact in a semiconductor device comprises determining a length of an overlap between first and second conductive elements separated by an insulation layer, determining dimensions of the electrical contact based on the length of the overlap, and forming the electrical contact between the first and second conductive elements.

In certain embodiments, the electrical contact has a width greater than a width of a fixed contact, and less than a sum of two times the width of the fixed contact and a predetermined distance between two fixed contacts.

BRIEF DESCRIPTION OF THE DRAWINGS

The drawings illustrate selected embodiments of the inventive concept. In the drawings, like reference numbers indicate like features. In addition, the relative dimensions of certain features have been exaggerated for clarity of illustration.

DETAILED DESCRIPTION

Embodiments of the inventive concept are described below with reference to the accompanying drawings. These embodiments are presented as teaching examples and should not be construed to limit the scope of the inventive concept.

Figure 1:
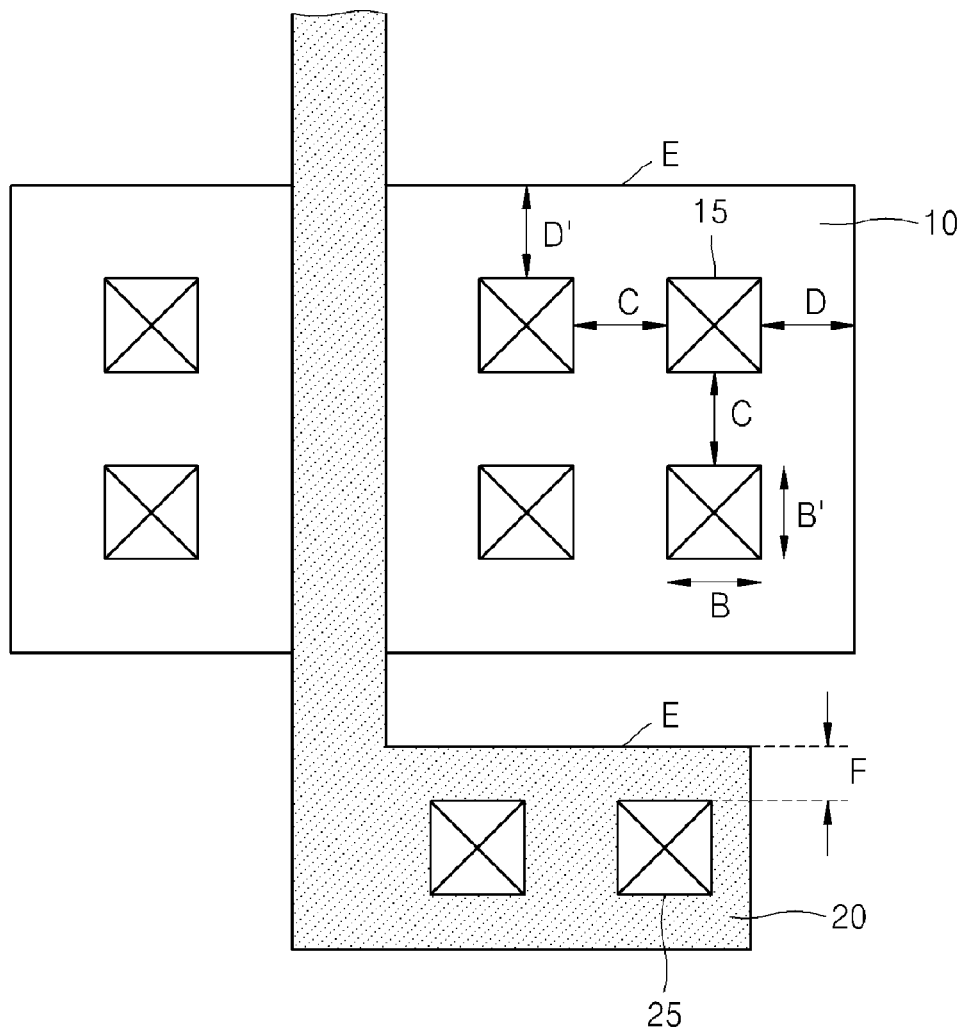
FIG. 1 is a plan view of a semiconductor device comprising electrical contacts according to an embodiment of the inventive concept.

FIG. 1 a plan view of a semiconductor device comprising electrical contacts according to an embodiment of the inventive concept. The plan view of FIG. 1 is used to illustrate the configuration and dimensions of the electrical contacts.

In some parts of a semiconductor device, such as a guard ring, a contact or via (hereinafter, a "contact" or "electrical contact") can have a bar-type structure in which a widthwise side or a longitudinal side has a variable length, and the other side has a fixed length. The variable-length side is typically longer than the other side. In other parts of a semiconductor device, such as where a transistor or metal net connection is formed, a contact can have a square-type structure in which both a widthwise side and a longitudinal side have fixed lengths.

FIG. 1 illustrates contacts 15 and 25 formed in a region of a semiconductor device. In a horizontal cross-section, contact 15 has a widthwise side with a fixed length B and a longitudinal side with a fixed length B'. A distance between contact 15 and adjacent contacts is C, and a distance between contact 15 and an edge E is D or D'. A distance between contact 25 and edge E is F, which is smaller than D. Contact 25 is formed in a line-shaped narrow region as illustrated in FIG. 1.

A first upper conductive region 10 comprises additional contacts 15 formed with substantially the same spacing and dimensions as contact 15 described above. A second upper conductive region 20 comprises an additional contact 25 formed with substantially the same dimensions and spacing as contact 25 described above. Contacts 15 formed in first upper conductive region 10 are connected to other conductive regions formed under first upper conductive region 10, and contacts 25 formed in second upper conductive region 20 are connected to other conductive regions formed under second upper conductive region 20. The conductive regions typically comprise wire layers, such as metal lines, or conductive regions, such as impurity regions acting as source/drain regions.

Figure 2:
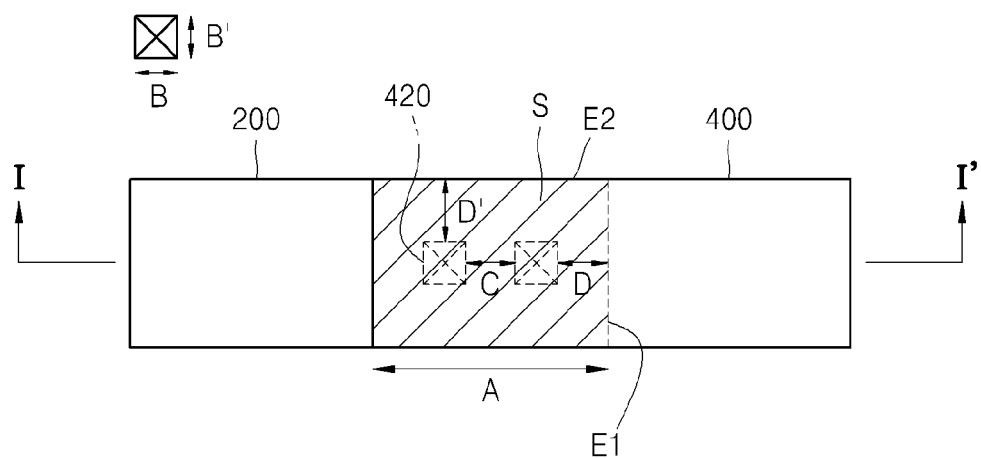
FIG. 2 is a plan view of a semiconductor device comprising electrical contacts according to an embodiment of the inventive concept.

FIG. 2 is a plan view illustrating a semiconductor device comprising electrical contacts according to an embodiment of the inventive concept. The plan view of FIG. 2 is used to illustrate how a size of electrical contacts can be varied according to an area of a region where the contacts are formed.

Referring to FIG. 2, a contact 420 is formed between a lower conductive portion 200 and an upper conductive portion 400. In a horizontal cross-section, contact 420 has a widthwise side with a fixed length B and a longitudinal side with a fixed length B'. Contact 420 is formed perpendicular to a substrate, and lower conductive portion 200 and predetermined portions of upper conductive portion 400 overlap each other. At least one insulating layer is interposed between lower conductive portion 200 and upper conductive portion 400.

An overlapping region S of lower conductive portion 200 and upper conductive portion 400 has a widthwise length A (hereinafter, referred to as an overlap widthwise side length A). To form two widthwise contacts in overlapping region S, length A should be greater than or equal to 2*B+2*D+C. Where length A is less than 2*B+2*D+C, only one contact is formed in overlapping region S. Where the number of contacts in overlapping region S is decreased from two to one, a contact resistance of overlapping region S increases and spatial use is lowered.

Figure 3:
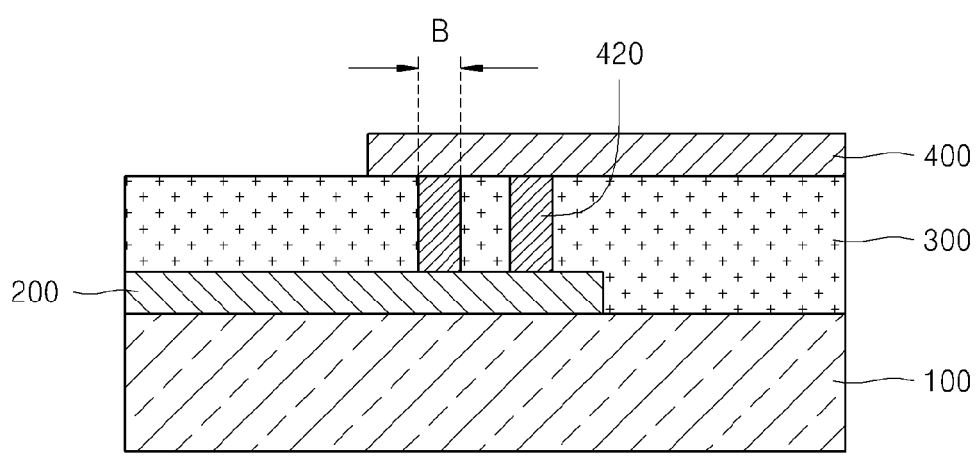
FIG. 3 is a cross-sectional view of the semiconductor device of FIG. 2, taken along a line I-I'.

FIG. 3 is a cross-sectional view of the semiconductor device of FIG. 2, taken along a line I-I.

Referring to FIG. 3, two contacts 420 are formed because length A is greater than or equal to 2*B+2*D+C, as illustrated in FIG. 2. Lower conductive portion 200 is formed on a substrate 100, an insulating layer 300 is formed on substrate 100 and on lower conductive portion 200, and upper conductive portion 400 is formed on insulating layer 300. Although one insulating layer 300 is formed, two or more insulating layers 300 can be formed between lower conductive portion 200 and upper conductive portion 400. In addition, other insulating layers can be formed where lower conductive portion 200 is not formed on substrate 100. The other insulating layers can have thicknesses similar to lower conductive portion 200.

Lower conductive portion 200 and upper conductive portion 400 are electrically connected to each other via two contacts 420 formed through insulating layer 300.

Figure 4:
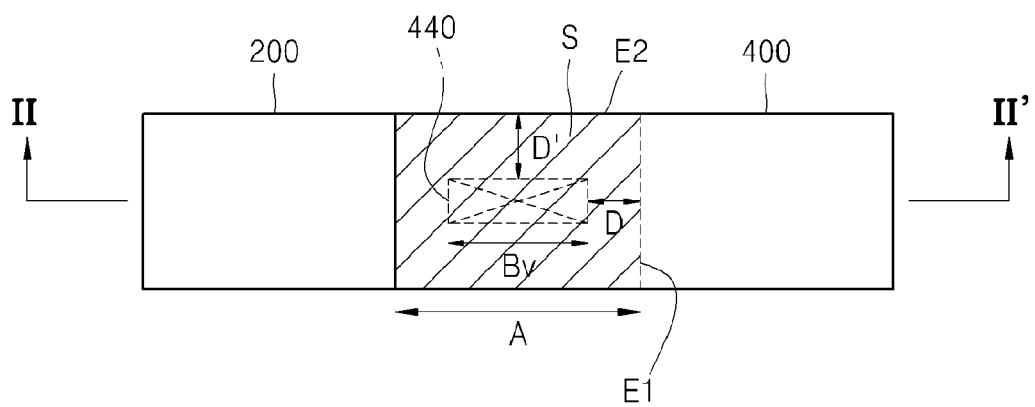
FIG. 4 is a plan view of a semiconductor device comprising an electrical contact according to an embodiment of the inventive concept.

FIG. 4 is a plan view of a semiconductor device comprising a variable-sized contact 440 according to an embodiment of the inventive concept.

Referring to FIG. 4, where length A is less than 2*B+2*D+C, the length of a widthwise side of a contact is not fixed as B. Where length A is less than 2*B+2*D+C and only one contact is formed, a contact resistance can increase, and spatial use can be lowered. To prevent the increase in contact resistance and the decrease in spatial use, a length Bv of the widthwise side of the contact varies according to length A. Hereinafter, a contact formed by varying length Bv of the widthwise side of the contact according to length A is referred to as variable-sized contact 440.

Length By of the widthwise side of variable-sized contact 440 is determined using the following equation (1).

$$B \leq Bv < 2*B+C \quad (1)$$

In equation (1), B is the fixed length of the widthwise side of contact 420, and C is a distance between contacts 420. Length Bv of the widthwise side of variable-sized contact 440 is between fixed length B and the sum of two times fixed length B and distance C.

Where length Bv is fixed length B, variable-sized contact 440 has the same dimensions as contact 420 (hereinafter, referred to as "a fixed contact"). Thus, length Bv need not vary. In other embodiments, equation (1) can be modified so that a minimum value of length Bv is limited to a value between 1.5*B and 2*B. Also, where length Bv of the widthwise side of variable-sized contact 440 is equal to 2*B+C, two contacts 440 can be formed.

By varying length Bv of the widthwise side of variable-sized contact 440, length Bv is typically greater than fixed length B of the widthwise side of fixed contact 420. Thus, a resistance in variable-sized contact 440 is generally reduced as compared to a resistance in a fixed contact, a cross-section of variable-sized contact 440 is relatively large as compared to that of the fixed contact, and certain processes for forming the contact are simplified, such as a mask forming process and a metal gap fill process.

Although the widthwise side of a contact has been described, the similar techniques can be performed to adjust a longitudinal side of the contact. For instance, the longitudinal side of the contact can also vary according to the length of a longitudinal side of overlapping region S using parameters similar to equation (1). Furthermore, both lengths of the widthwise side and the longitudinal side of variable-sized contact 440 can be varied in consideration of the widthwise side and the longitudinal side of overlapping region S.

Figure 5:
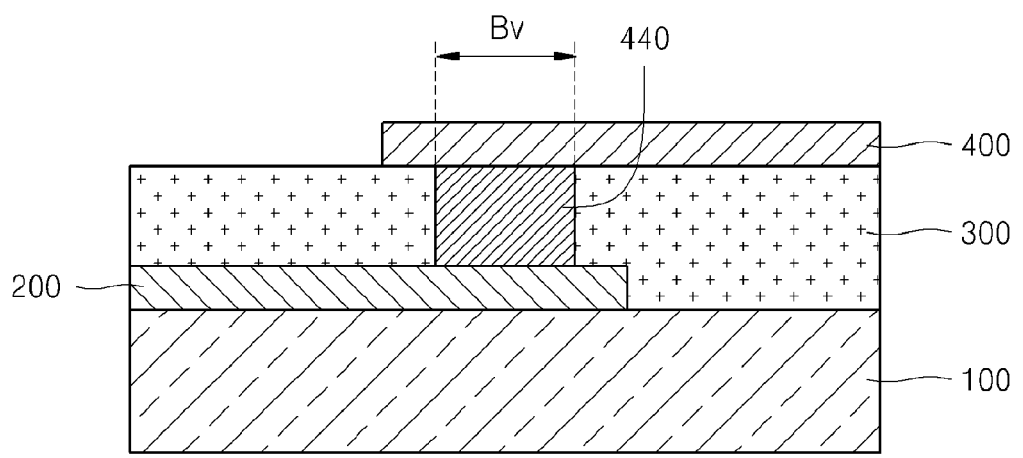
FIG. 5 is a cross-sectional view of the semiconductor device of FIG. 4, taken along a line II-II'.

FIG. 5 is a cross-sectional view of the semiconductor device of FIG. 4, taken along a line II-IF.

Referring to FIG. 5, the semiconductor device comprises substrate 100, lower conductive portion 200, an insulating layer 300, upper conductive portion 400, and variable-sized contact 440.

Substrate 100 can take a variety of forms, such as a group IV semiconductor substrate, a group III-V compound semiconductor substrate, or a group II-VI oxide semiconductor substrate. The group IV semiconductor substrate can comprise, for instance, a silicon substrate, a germanium substrate, or a silicon-germanium substrate. Substrate 100 can comprise a bulk wafer or an epitaxial layer.

Lower conductive portion 200 is formed on substrate 100 and is typically formed of a semiconductor, such as silicon or polysilicon, or a conductor, such as copper (Cu), aluminum (Al), tungsten (W), or platinum (Pt). Lower conductive portion 200 can also be used to form an impurity region, such as a source/drain region, by performing ion doping. Although lower conductive portion 200 is formed directly on substrate 100, other insulating layers or conductive layers can be formed between substrate 100 and lower conductive portion 200.

Insulating layer 300 is interposed between lower conductive portion 200 and upper conductive portion 400 and is formed of an insulating material, such as an oxide or a nitride. Although one insulating layer 300 is formed between lower conductive portion 200 and upper conductive portion 400, a plurality of different insulating layers can be formed between lower conductive portion 200 and upper conductive portion 400. Also, other insulating layers can be formed on substrate 100, and insulating layer 300 can be formed on the other insulating layers formed on substrate 100.

Upper conductive portion 400 is formed on insulating layer 300, and all regions having conductivity may correspond to upper conductive portion 400. Upper conductive portion 400 can be formed of the same material or a different material from lower conductive portion 200.

Variable-sized contact 440 is formed through insulating layer 300 and electrically connects lower conductive portion 200 and upper conductive portion 400. Thus, variable-sized contact 440 is typically formed of a conductive material, such as aluminum, tungsten, or copper, to reduce a contact resistance. Variable-sized contact 400 can formed by forming a contact hole using a photolithography process and then filling the contact hole with a metal using a gap filling process.

In some embodiments, length Bv of the widthwise side of variable-sized contact 440 is not fixed but varies. For example, where length A of the overlapping widthwise side is less than 2*B+2*D+C, length Bv of the widthwise side of variable-sized contact 440 typically does not have the fixed length B but has a variable length according to equation (1).

The semiconductor device of FIG. 5 can be used in a variety of contexts, such as a memory chip in the form of a dynamic random access memory (DRAM) or flash memory, or a logic chip comprising a logic circuit.

Figure 6:
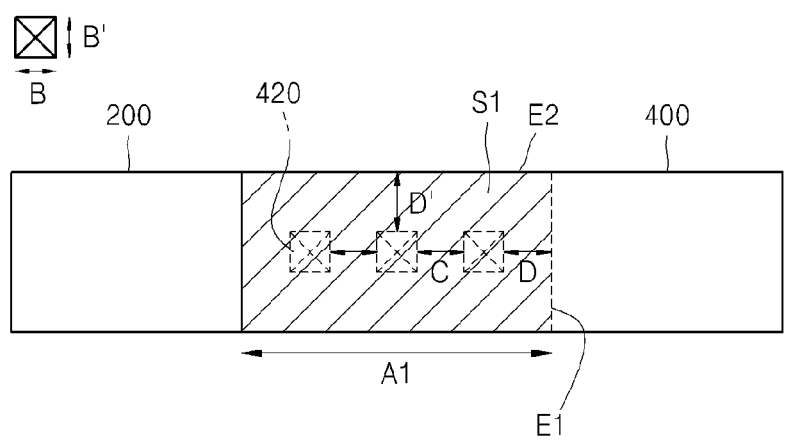
FIG. 6 is a plan view of a semiconductor device comprising electrical contacts according to an embodiment of the inventive concept.

FIG. 6 is a plan view illustrating a semiconductor device comprising electrical contacts according to an embodiment of the inventive concept. The plan view of FIG. 6 is used to illustrate variation in the size of contact 420 according to the area of a region where three contacts 420 are formed.

Referring to FIG. 6, where three contacts 420 are formed in an overlapping region S1, a length A1 of the overlapping widthwise side is greater than or equal to 3*B+2*D+2° C. However, where length A1 of the overlapping widthwise side is less than 3*B+2*D+2° C. and greater than or equal to 2*B+2*D+2° C., only two contacts 420 should be formed. Where two contacts 420 are formed in this manner, spatial use may be lowered, and contact resistance may increase.

Figure 7:
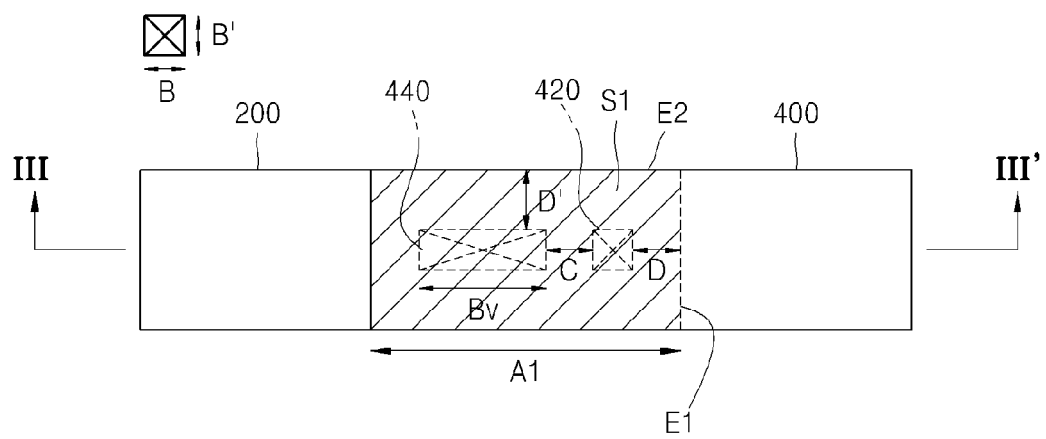
FIG. 7 is a plan view of a semiconductor device comprising electrical contacts according to an embodiment of the inventive concept.

FIG. 7 is a plan view of a semiconductor device comprising variable-sized contact 440 according to another embodiment of the inventive concept.

Referring to FIG. 7, one contact is formed as a fixed contact 420 having a fixed length of a widthwise side, and another contact is formed as variable-sized contact 440. The length of a widthwise side of variable-sized contact 440 varies according to equation (1). By forming fixed contact 420 and variable-sized contact 440 in a narrow overlapping region S1, the contact resistance of the semiconductor device is reduced and its use of space is improved.

Also, the longitudinal side of variable-sized contacts 440 can be adjusted similar to the widthwise side.

Figure 8:
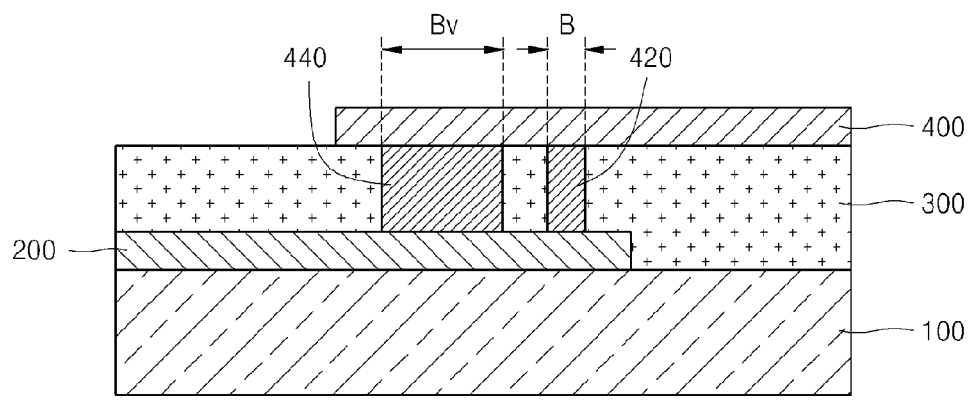
FIG. 8 is a cross-sectional view of the semiconductor device of FIG. 7, taken along a line III-III'.

FIG. 8 is a cross-sectional view of the semiconductor device of FIG. 7, taken along a line III-III.

Referring to FIG. 8, the semiconductor device comprises substrate 100, lower conductive portion 200, insulating layer 300, upper conductive portion 400, fixed contact 420, and variable-sized contact 440. Substrate 100, lower conductive portion 200, insulating layer 300, upper conductive portion 400, fixed contact 420, and variable-sized contact 440 have been sufficiently described with reference to FIG. 5 and thus, a further description thereof will not be provided here.

As illustrated in FIG. 8, two contacts are formed. In particular, fixed contact 420 having fixed length B of the widthwise side and variable-sized contact 440 having variable length Bv of the widthwise side that varies according to equation (1) is formed. Variable-sized contact 440 is formed in this manner to reduce the overall contact resistance of the semiconductor device.

Figure 9:
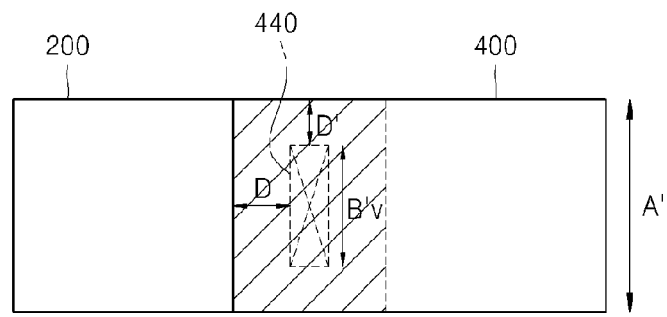
FIG. 9 is a plan view of a semiconductor device comprising an electrical contact according to an embodiment of the inventive concept.

FIG. 9 is a plan view of a semiconductor device comprising variable-sized contact 440 according to another embodiment of the inventive concept.

FIG. 9 shows variable-sized contact 440 having a variable length B'v on a longitudinal side. Length B'v varies with constraints similar to equation (1). In particular, length B'v of the longitudinal side of variable-sized contact 440 varies while satisfying $B' \leq B'v < 2*B'+C$. A minimum value of the longitudinal side of variable-sized contact 440 is limited to a range between 1.5*B' and 2*B', similar to the widthwise side of variable-sized contact 440 described above.

As described above, in certain embodiments, a variable-sized contact can replace two contacts where the two contacts are not readily formed. In other embodiments, one or more variable-sized contacts can replace three or more contacts. For example, where five contacts are not readily formed, two variable-sized contacts can replace two of the five contacts, while one or more fixed contacts replace the remaining three contacts.

Figure 10:
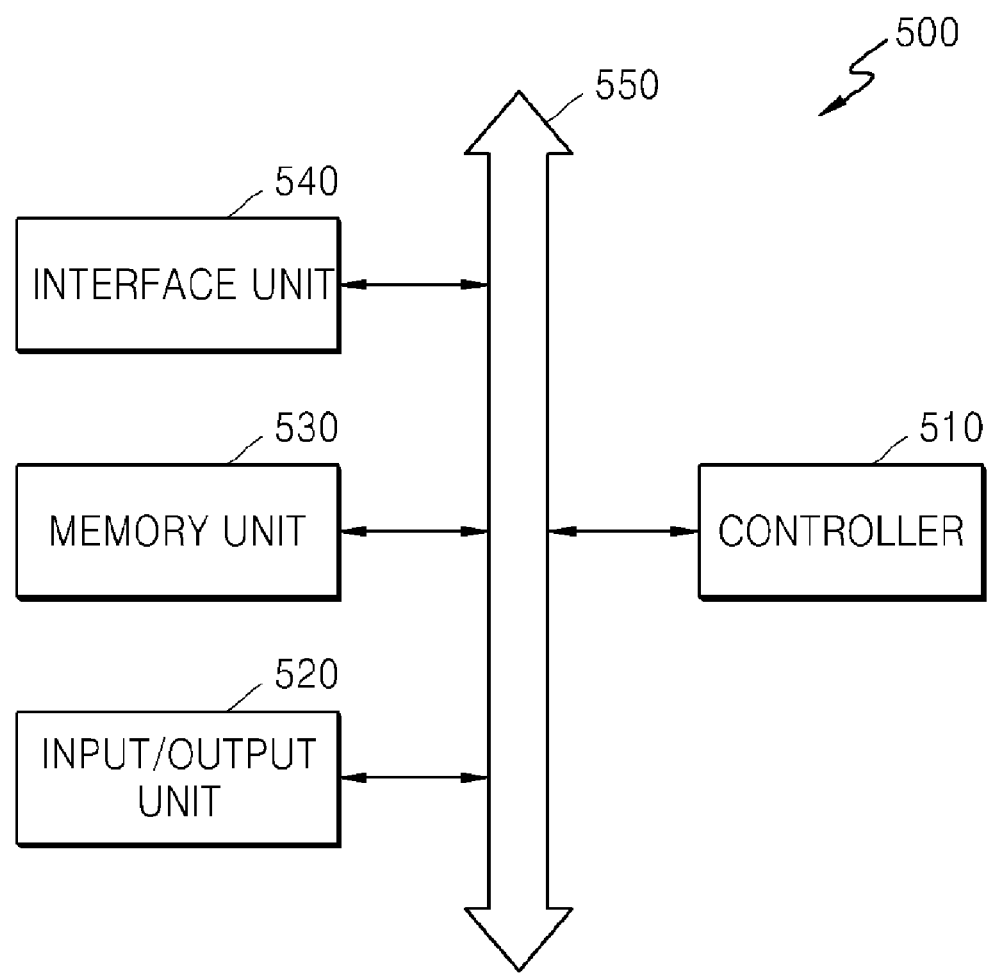
FIG. 10 is a block diagram illustrating an apparatus comprising a semiconductor device according to an embodiment of the inventive concept.

FIG. 10 is a block diagram illustrating an apparatus 500 comprising a semiconductor device according to an embodiment of the inventive concept.

Referring to FIG. 10, apparatus 500 comprises a controller 510, an input/output unit 520, a memory unit 530, an interface unit 540, and a bus 550. Controller 510, input/output unit 520, memory unit 530, and interface unit 540 are connected to one another via bus 550.

Controller 510 comprises at least one processor for executing commands, such as a microprocessor, a digital signal processor, or a microcontroller.

Input/output unit 520 receives data or signals from an external source and outputs data or signals to an external destination. Input/output unit 520 may comprise, for instance, a keyboard, a keypad, or a display device.

Memory unit 530 stores data and commands executed by controller 510, and can comprise any of various types of memories, such as a DRAM or a flash memory. Interface unit 540 typically exchanges data by communicating with a network.

Apparatus 500 can incorporate one of the semiconductor devices of FIGS. 4-5, 7-8, and 9 as controller 510, memory unit 530, or interface unit 540. As examples, the semiconductor devices can take the form of memory chips or logic chips forming controller 510, memory unit 530, and interface unit 540.

Apparatus 500 can be used in a mobile system, such as a personal digital assistant (PDA), a portable computer, a web tablet, a wireless phone, a mobile phone, a digital music player, a memory card, or a data transmission or receiving device.

Figure 11:
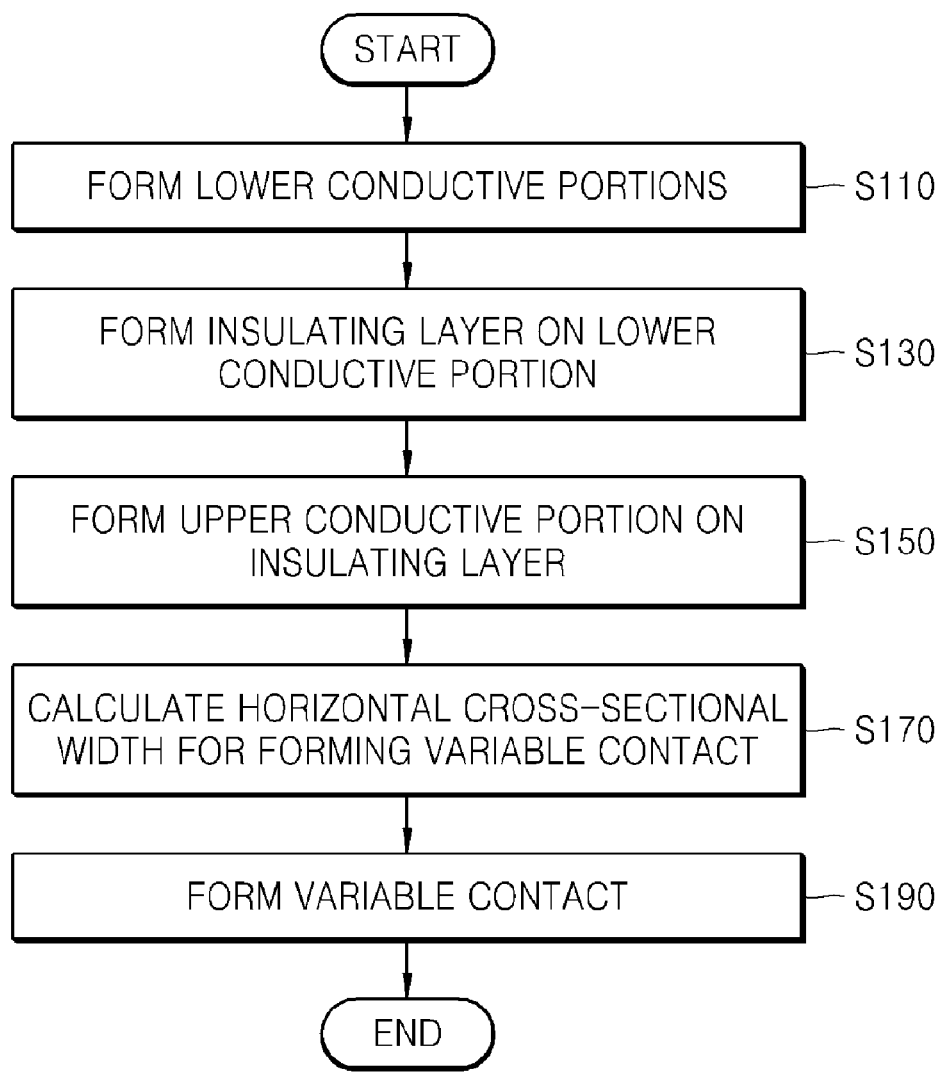
FIG. 11 is a flowchart illustrating a method of forming an electrical contact according to an embodiment of the inventive concept.

FIG. 11 is a flowchart illustrating a method of forming a variable-sized contact according to an embodiment of the inventive concept. The method of FIG. 11 will be described with reference to FIG. 5. In the description that follows, example method steps are indicated by parentheses.

Referring to FIG. 11, lower conductive portion 200 is formed on substrate 100 (S110). Next, insulating layer 300 is formed on lower conductive portion 200 (S130). Thereafter, upper conductive portion 400 is formed on insulating layer 300 (S150). In the description related to FIG. 5, substrate 100, lower conductive portion 200, insulating layer 300, and upper conductive portion 400 have been described in detail, and thus, a further description thereof will be omitted.

After upper conductive portion 400 is formed in operation S150, a horizontal cross-sectional width for forming variable-sized contact 440 is calculated (S170). The horizontal cross-sectional width of variable-sized contact 440 can be calculated by measuring or calculating an overlapping region after upper conductive portion 400 is formed. Alternatively, the overlapping region can be calculated before manufacturing the semiconductor device and the horizontal cross-sectional width of variable-sized contact 440 can be calculated according to a size of the overlapping region. The overlapping region and the horizontal cross-sectional width of variable-sized contact 400 can be automatically calculated using a computer program according to the size of the overlapping region.

After the horizontal cross-sectional width of variable-sized contact 440 is calculated, variable-sized contact 440 is formed according to the calculated horizontal cross-sectional width (S190).

Figure 12:
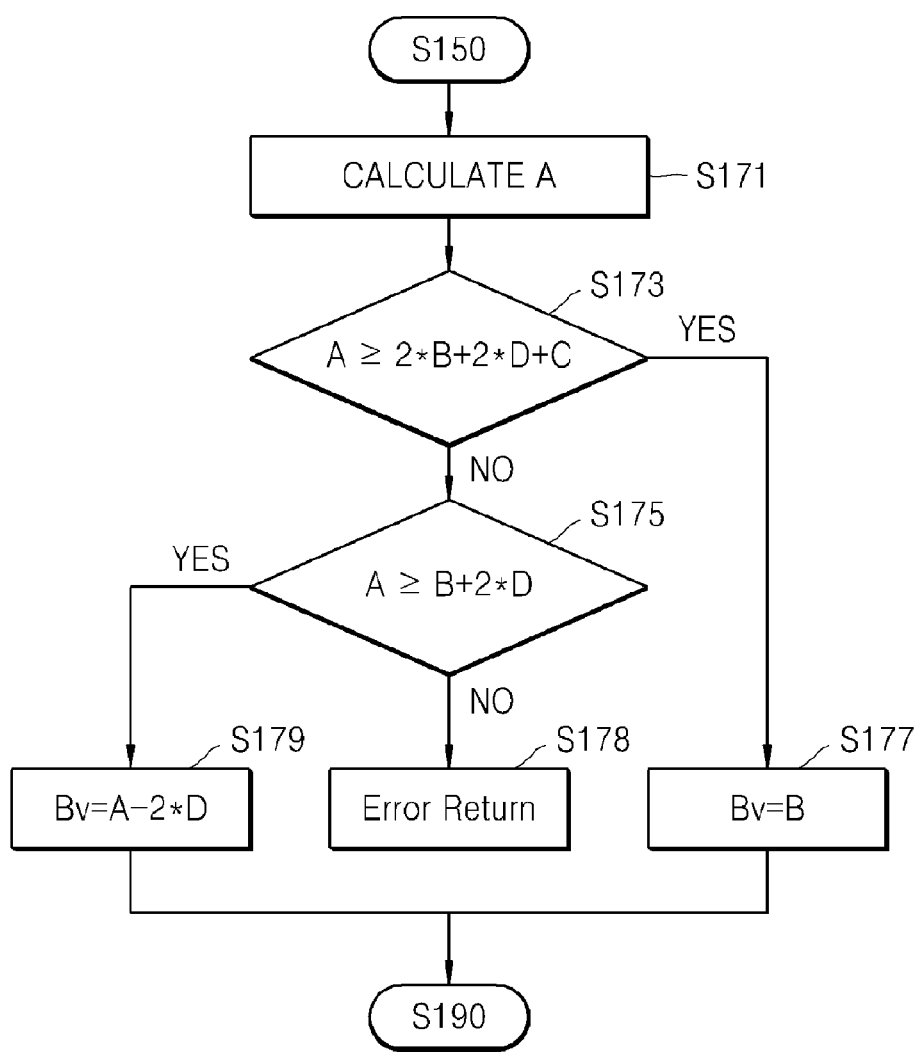
FIG. 12 is a flowchart illustrating an operation for calculating a horizontal cross-sectional width of the electrical contact of FIG. 11.

FIG. 12 is a flowchart illustrating a method of calculating a horizontal cross-sectional width of variable-sized contact 440 of FIG. 11.

Referring to FIG. 12, the method first calculates length A of the overlapping widthwise side overlapping region S (S171). Next, the method determines whether length A is greater than or equal to 2*B+2*D+C (S173). Where length A is greater than or equal to 2*B+2*D+C (S173=Yes), two contacts are to be formed. Thus, length Bv of the widthwise side of variable-sized contact 440 is set to fixed length B of the widthwise side of fixed contact 420 (S177), and two fixed contacts are formed (S190).

Otherwise, where length A is less than 2*B+2*D+C (S173=No), the method determines whether length A is greater than or equal to B+2*D (S175). Where length A is greater than or equal to B+2*D, length Bv of the widthwise side of variable-sized contact 440 is set to A−2*D (S179).

Here, A−2*D is determined according to the following inequalities: B+2*D≦A<2*B+2*D+C, and B<A−2*D<2*B+C. Thus, one variable-sized contact is formed (S190).

Otherwise, where length A is less than B+2*D, because any contacts cannot be formed in overlapping region S, an error message is transmitted, and calculation of length A is finished (S178).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of forming a variable-sized contact, comprising:
    forming a lower conductive portion on a substrate;
    forming at least one insulating layer on the lower conductive portion;
    forming an upper conductive portion on the at least one insulating layer, the upper conductive portion overlapping the lower conductive portion in a first direction to define an overlap region having a first length;
    calculating a horizontal cross-sectional width of the variable-sized contact according to the first length; and
    forming the variable-sized contact with the horizontal cross-sectional width in the first direction, the variable-sized contact connecting the lower conductive portion to the upper conductive portion.

2. The method of claim 1, wherein, where the first length is greater than a minimum length required to form one fixed contact and less than a minimum length required to form two fixed contacts, the horizontal cross-sectional width of the variable-sized contact is between a horizontal cross-sectional width of a fixed contact and a sum of a distance between two fixed contacts and horizontal cross-sectional widths of the two fixed contacts.

3. The method of claim 1, wherein, where the first length is A, a horizontal cross-sectional width of a fixed contact is B, and a distance between two fixed contacts is C, the horizontal cross-sectional width of the variable-sized contact is between B and 2*B+C.

4. The method of claim 3, wherein a minimum horizontal cross-sectional width of the variable-sized contact is between 1.5*B and 2*B.

5. The method of claim 3, wherein calculating of the horizontal cross-sectional width of the variable-sized contact comprises:
    calculating A;
    determining a distance D from a boundary line of the overlap region to the fixed contact;
    determining whether A is greater than or equal to 2*B+2*D+C;
    upon determining that A is greater than or equal to 2*B+2*D+C, defining the horizontal cross-sectional width of the variable-sized contact as B, and forming two variable-sized contacts in the overlap region;
    upon determining that A is less than 2*B+2*D+C, determining whether A is greater than or equal to B+2*D; and
    upon determining that A is greater than or equal to B+2*D, defining the horizontal cross-sectional width of the variable-sized contact as A−2*D, and forming only one variable-sized contact in the overlap region.

6. The method of claim 5, wherein a computer program automatically performs the calculating A, the determining whether A is greater than or equal to 2*B+2*D+C, and the determining whether A is greater than or equal to B+2*D.

7. The method of claim 3, wherein the overlap region has a second length A' in a second direction perpendicular to the first direction, a distance D' separates the variable-sized contact from a boundary line of the overlap region, the fixed contact has a horizontal cross-sectional width B', and the variable-sized contact has a horizontal cross-sectional width in the second direction that is between B' and 2*B'+C.

8. The method of claim 1, wherein, where the first length is greater than a minimum length required to form one fixed contact and is less than a length required to form n fixed contacts (n>2), m variable-sized contacts are formed, wherein m is an integer less than or equal to n/2, and respective horizontal cross-sectional widths of the variable-sized contacts are greater than or equal to a horizontal cross-sectional width of one fixed contact and less than a sum of a distance between two fixed contacts and horizontal cross-sectional widths of the two fixed contacts.

9. The method of claim 1, wherein a predetermined number of variable-sized contacts are formed with a first horizontal cross-sectional width less than a sum of a distance between n contacts (n>2) and horizontal cross-sectional widths of the n contacts.

10. The method of claim 9, wherein the variable-sized contacts comprise a combination of a first variable-sized contact having the first horizontal cross-sectional width and second variable-sized contacts having a second horizontal cross-sectional width less than a sum of a distance between m contacts and horizontal cross-sectional widths of the m contacts, where m is a positive integer.

11. A method of forming an electrical contact in a semiconductor device, comprising:
    determining a length of an overlap between first and second conductive elements separated by an insulation layer;
    determining dimensions of the electrical contact based on the length of the overlap; and
    forming the electrical contact between the first and second conductive elements.

12. The method of claim 11, wherein the electrical contact has a width greater than a width of a fixed contact, and less than a sum of two times the width of the fixed contact and a predetermined distance between two fixed contacts.

* * * * *